United States Patent [19]

Gaulder

[11] 4,135,590

[45] Jan. 23, 1979

[54] NOISE SUPPRESSOR SYSTEM

[76] Inventor: Clifford F. Gaulder, 463 Salem St., Wilmington, Mass. 01887

[21] Appl. No.: 708,894

[22] Filed: Jul. 26, 1976

[51] Int. Cl.² .................................................. H03G 3/34
[52] U.S. Cl. ...................................... 179/1 P; 330/155
[58] Field of Search .................. 179/1 P, 1 D, 1 VL; 325/478, 348, 402; 330/126, 155; 333/17; 328/165

[56] References Cited

U.S. PATENT DOCUMENTS

| | | | |
|---|---|---|---|
| 2,606,972 | 8/1952 | Scott | 179/1 P |
| 3,180,936 | 4/1965 | Schroeder | 179/1 P |
| 3,213,372 | 10/1965 | Kurvits | 179/1 P |
| 3,403,224 | 9/1968 | Schroeder | 179/1 P |
| 3,539,725 | 11/1970 | Hellwarth | 179/1 D |
| 3,678,416 | 2/1972 | Burwen | 179/1 P |
| 4,000,369 | 12/1976 | Paul | 179/1 P |

*Primary Examiner*—Kathleen H. Claffy
*Assistant Examiner*—E. S. Kemeny
*Attorney, Agent, or Firm*—Donald Brown

[57] ABSTRACT

A noise suppressor system uses a set of parallel bandpass filters to transform an input signal into a plurality of spectral adjacent band signals. Each band signal may then be substantially attenuated (squelched) by an attenuation-control circuit when it drops below a predetermined noise threshold. All band signals are then summed to reform essentially the original but noise-suppressed signal. Features of the invention include essentially linear control-attenuation circuitry, and ganged input-output manual level controls for dynamic range matching at constant overall gain.

13 Claims, 6 Drawing Figures

NOISE SUPPRESSOR SYSTEM

BACKGROUND OF THE DISCLOSURE

This invention is directed to an audio noise suppressor system of the open end type, i.e., one in which the audio spectrum is divided into a number of bands, in each of which output is suppressed independently of the others if the signal within that band is insufficient to override or mask noise.

The term 37 noise" is generally used to describe that part of the output of a communication channel which is not present in the input to the channel and which is not dependent on the input. The definition is usually further limited to that portion of the output which is non-systematic (i.e. not periodic or coherent) in nature, e.g., thermal or white noise, in order to distinguish it from "hum" or "ripple" due to imperfect filtering in the power supply to the equipment, etc., and from signal information resulting from mechanical imperfections, e.g., turntable rumble.

The invention herein is directed to the suppression of the aforementioned non-systematic noise. The device thought to be the fore runner of such open ended systems to which in applicant's opinion the present invention is most closely related is generally credited to H. F. Olson and dates back to about 1947. The Olson device split the upper audio spectrum into bands an octave or less wide by means of adjacent bandpass filters.

In this system signals below some threshold level in each band were discarded altogether, and signals larger than some small factor above that threshold were reproduced at full amplitude. The threshold was established by means of some non-linear device, such as back-to-back diodes, which would not pass small signals; the system was adjusted so that the noise signals were just below the threshold.

The presence of the non-linear devices caused substantial harmonic distortion for signals not too far above the threshold. It was necessary, then, to have bandpass filters following as well as preceding the non-linear devices, in order to discriminate against the harmonic distortion products: the choice of bands an octave wide or less was dictated by that consideration. In addition, there were intermodulation products within the individual bands, which could not be eliminated.

A modification credited to Price employed a balanced clipping system which, by eliminating even-order harmonics from the low-level distortion products, enabled the widths of the bandpass filters to be greater than one octave. The main advantage was economic (fewer filters); the wider bands resulted in somewhat more serious in-band intermodulation.

In more recent years there has been a revival of the Olson approach in the Kenwood brand "de-noiser" device and the Phase Linear brand "autocorrelator". The Kenwood device inverts the principle of the Olson system and employs cascaded band-stop filters, which are bypassed when signals are strong, rather than parallel bandpass filters which are disabled when signals are weak. Each filter is controlled by a corresponding tuned amplifier; when the signal in the latter is above some threshold level, a symmetrical detector causes current to flow in diodes which shunt the corresponding band-stop filter, permitting the previously rejected portion of the total signal to be transmitted.

There is a manual threshold control, which is adjusted by ear until the noise component of the signal is just insufficient to open up the band-stop filters. Signals significantly above the threshold thus set will open the filters, and will therefore be reproduced at full amplitude.

The Kenwood device has two advantages over the original Olson system in principle, and a third in practice. First, the uniformity of the large-signal response is not dependent on critical matching of adjacent bandpass filters, so that the large-signal response is virtually flat. Second, the distortion introduced by the diodes shunting the filters (and functioning as variable resistors) is lower than that introduced by the clippers used in the Olson system; however, this distortion is still comparatively large, and is significant when the noise level (and thus the signal level at which the diodes are in the intermediately conducting condition) is comparatively high. Third, in practice the threshold control can be adjusted to suit the input signal (within the overall limitations of the device), rather than requiring the input level to be adjusted to suit the fixed diode threshold.

The disadvantages of the system relative to the Olson device are: it is much more difficult to make band-stop filters to produce high, uniform attenuation over a narrow band of frequencies than to achieve the same result by switching out a bandpass filter; and the system requires tuned amplifiers as well as filters. The first of these relates to performance, in that the "sloppiness" of the cascaded filters could cause attenuation to occur in adjacent portions of the spectrum in which there was nevertheless enough signal to override noise in the vicinity of the signal. This becomes intolerable if an attempt is made to achieve more than 10 db of noise attenuation. The second disadvantage relates to cost.

The Phase Linear brand system, despite its name, differs from the Kenwood device only in a few particulars. Its cascaded band-stop filters are comparatively broad twin-T resistance-capacity types, instead of inductance-capacity as in the Kenwood; and its tuned control amplifiers employ resistance-capacity feedback to obtain a bandpass characteristic, again instead of inductance-capacity tuning. The threshold control employs audio automatic gain control (described as "logarithmic amplification"). Functionally this system is quite similar to the Kenwood device except that it employs fewer band-stop filters.

In addition to the above described open-ended noise suppression system there have in the past been developed other open-ended systems termed a dynamic noise filter system. These systems recognized that the perception of sound at low intensities is to some degree an inverse function of bandwidth. Thus, low-level high-frequency signals are less well heard than medium-frequency signals at comparable levels.

Correspondingly, the effect of discarding low-level high-frequency signals is less perceptible than that of discarding high-level high-frequency signals. Thus the system was designed so that its bandwidth increased as signal increased from some low level to some intermediate level, and therefore the effect was to reduce perception of noise with comparatively little perceived loss of signal bandwidth.

Once the bandwidth reaches the maximum, of course, all the noise present in the original signal is reproduced; but this only occurs when the signal is so large that the noise is at least partially masked by the intense signal. This principle was employed in the "dynamic noise suppressor" system credited to H. H. Scott (1946). A more sophisticated embodiment of the same principle was that credited to R. S. Burwen ("dynamic noise filter"), during the present decade; in that version, the bandwidth was made a function of both signal level and frequency, so that relatively small high-frequency signals were as effective in opening up bandwidth as large medium-frequency signals.

These dynamic noise filters of Scott and Burwen in their original form suffered from "noise-pumping", i.e., an audible increase in noise level, during musical passages in which the low-frequency content was large enough to open up the bandwidth, but in which there was insufficient high-frequency content to mask the noise which was thus allowed to pass through the system. In Burwen's embodiment of the principle, the noise-pumping was much reduced by the frequency-dependent control system, but another problem, that of "noise trailing" or "swoosh", could not be eliminated. The names refer to a phenomenon in which, after abrupt cessation of a loud passage, noise is fully audible, and trails away to a relatively low level over an appreciable interval of time.

The phenomenon is the result of the necessity to make the decay time of the control system much longer than the attack time in order to avoid severe intermodulation of high frequencies by large low-frequency signals to which the system inevitably remains somewhat sensitive. As a result, although such devices perform reasonably well when the noise is to be reduced in fairly low to begin with, they produce random-seeming effects, which are generally less acceptable than the steady noise would have been, when the noise level is of the order of that obtained from constant-velocity disc records.

The open-ended systems mentioned above and the present invention have in common the advantage of not requiring that the material with which they are used be pre-processed in any way. They are thus of general usefulness, unlike the various compandor systems known in the art. However, they share a common disadvantage: that there is some loss of high-frequency signal when it is insufficient to mask noise fully; either that, or the threshold or suppression controls must be set so as to permit substantially more noise to be transmitted than the system's capabilities warrant. This is, of course, inherent in the fact that the systems tackle the noise problem head on instead of avoiding it by artificially raising the threshold of signal relative to noise, as the compandors do.

The Olson type related systems as well as the system of this invention have an important advantage relative to the Scott system. The signals controlling the high-frequency filters are of essentially the same narrow bandwidth as the filters themselves, and do not have to cover a large portion of the audio spectrum. Thus, the release time can be a great deal shorter, there being no danger of modulation of high frequencies by low. Therefore, noise trailing is not a factor in the performances of the aforementioned Olson related systems.

Of the latter more recent Olson related systems, i.e., the Kenwood and Phase Linear brand systems, they are limited in noise-reducing performance by the use of band-stop rather than band-pass filtering, and employ signal-control techniques of an essentially non-linear character. In addition, they are inherently relatively costly because of the requirement for tuning in the control system as well as in the signal section. These problems are avoided in the noise suppressor of the present invention which because of its construction has notably superior performance in the presence of heavy noise such as that of a constant-velocity disc record or early tape recording.

In summary, all the open-ended systems perform well in the presence of slight noise; however, the noise suppressor of the present invention produces significant improvements thereover when noise is severe.

BRIEF SUMMARY OF THE DISCLOSURE

The noise suppressor system of this invention improves the apparent signal to noise ratio of audio sources of home music systems and is also useful in many professional applications. The noise suppressor system of this invention is generally coupled between the output of a pre-amplifier and the input of a power amplifier in conventional high fidelity component systems.

In dual channel or quad systems, two or four of the noise suppressor systems will be used. In practice, the invention herein is intended to be sold in a cabinet containing a conventional power supply and two noise suppressor systems, one for each channel of the conventional stereo systems.

In addition, the noise suppressor of this system may also be conveniently coupled to the tape monitor connections on a preamplifier, integrated amplifier or receiver.

Other uses for the present invention would be apparent to those skilled in the art. The preferred form of the invention is capable of producing 20 db of quieting during "silent" passages, and 14 db of effective quieting when signal is present, over a range of signal-to-noise ratios from 60 to 20 db relative to a voltage reference level.

With modern, reasonably quiet signal sources, there is no perceptible effect on signal bandwidth as heard: quite low-level signals are strong enough to mask noise, and these are transmitted at full bandwidth. On the other hand, large signals in one part of the frequency range, which do not mask noise in other parts of the spectrum, do not "pump" such noise. (For instance, 5000 Hz noise is not transmitted when a strong 1000 Hz signal is present, nor 12,000 Hz noise when 5000 Hz signal is present, unless of course signal is also present in the higher bands.)

With very noisy sources, such as European or early American 78 rpm records played back correctly (without treble de-emphasis), the noise suppressor reduces noise in the same proportion, but of course the residual noise level is higher. Its action is not then so unobtrusive: high-frequency signal just above noise does not produce full masking, but cannot be discarded altogether without disconcerting results, so such signals are expanded from threshold to about 10 db above threshold and thereafter reproduced at full amplitude. There is thus discernible reduction of low-level high-frequency signal amplitude. However, the spectrum being divided, noise pumping is minimal, and there is no need for slow release times. Thus, there is no noise "trailing" after transients in the music (e.g., piano), or after clicks and pops.

The noise suppression system of this invention accomplishes noise suppression by splitting the audio spectrum into a plurality of adjacent bands using subsystems having bandpass filtering means, summing the output from each of the subsystems and providing control means in at least some of the subsystems for controlling the magnitude of the output from each of said subsystems depending upon the magnitude of the output from each of said subsystems depending upon the magnitude of the signals in the band defined by the filter of the subsystem.

More particularly the control means preferably comprises means for generating a control signal whose magnitude represents the combined magnitude of all signals in each band, said control signal variably adjusting the resistance of a variable resistor so as to increase or decrease the magnitude of the output signal depending upon the ratio of signal to noise in the band, the higher the signal over noise in the band the greater the output signal and conversely the greater the noise in comparison to the signal the lower the output signal.

In the preferred embodiment, a field effect transistor most preferably a specialized type such as a VCR is controlled to provide the variable resistance to control the magnitude of the output signal from the subsystem to which it is coupled.

DETAILED DESCRIPTION OF THE DISCLOSURE

Figure 1:
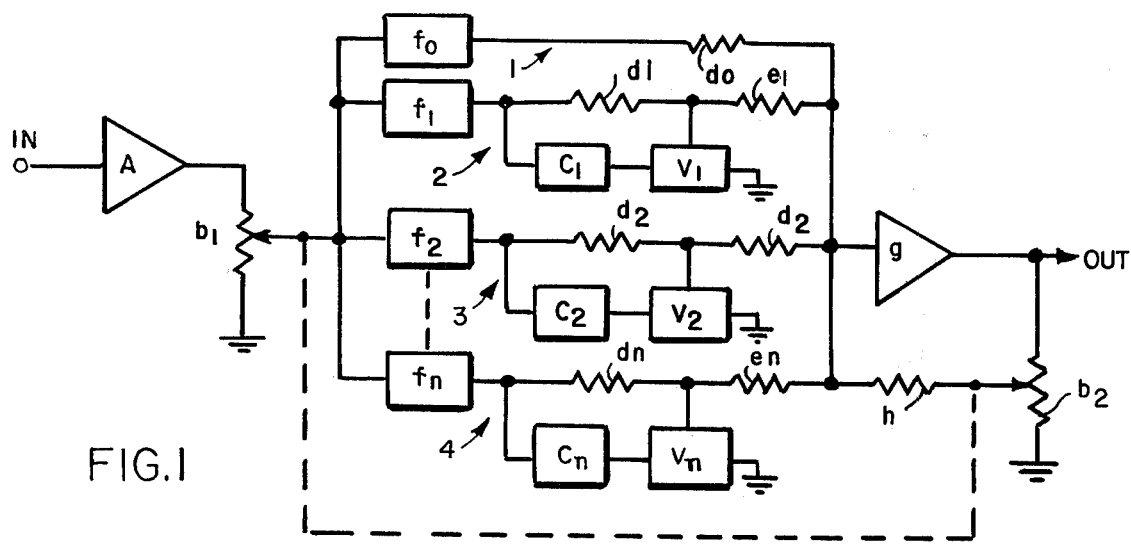
FIG. 1 is a block diagram illustrating the preferred form of the noise suppressor system invention for a single audio channel.

Reference should now be had to FIG. 1 which shows in block diagram form the preferred embodiment of the invention. In the preferred embodiment of the invention n = 3 so that the audio spectrum is divided up into four bands, e.g., 20 - 300 Hz by a first subsystem "1" which has no active control and which is represented by bandpass filter $f_o$ and resistor $d_o$, 300 - 3000 Hz by a second subsystem "2" comprising bandpass filter $f_1$, resistor network $a_1$, and control $c_1$ and $v_1$ which is preferably controlled so that there is an output therefrom except during silent passages, 3000 - 7000 Hz by a third subsystem "3" comprising bandpass filter $f_2$, resistors $a_2$ and $d_2$ and control $c_2$ and $v_2$ and 7000 - 20000 Hz by a fourth subsystem "4" comprising bandpass filter $f_n$, resistors $a_n$ and $d_n$ and control $c_n$ and $v_n$ where n = 3.

It should be understood that n could be greater than 3, e.g., 4, 5 or more if it is desired to increase the number of bands to achieve even better performance, however, this would substantially increase the expense of the system as the number of subsystems are increased.

The input to each of the first to fourth subsystems numbered 1 to 4 as described in the foregoing is preferably provided by an isolating amplifier A and a potentiometer $b_1$ at the output. The resistors do, to $d_n$ and $e_1$ to $e_n$ where n is 3 are input resistors to a conventional current summing amplifier g with feedback controlled by potentiometer $b_2$ through resistor h. The blocks labelled $c_1$ to $c_n$ (n = 3) are amplifier rectifiers for generating a control signal to control voltage controlled resistors $v_1$ to $v_n$ (n = 3) such as FET'S identified in the trade as a VCR 7N.

The voltage controlled resistors partly or wholly bypass the signal currents in resistors $d_1$, $d_2$, and $d_n$ (n = 3) and $e_1$, $e_2$ and $e_n$ (n = 3) so that these currents contribute only in the desired degree based on signal to noise in the band to the output of amplifier g.

The system operates as follows: by means of filters $f_o$ - $f_n$ (n = 3), the audio spectrum is divided into four adjacent bands, in such a way that when all filters are contributing to the output of the system the frequency response relative to the input to A has the desired characteristics with a sufficient degree of uniformity. In most applications this response will be nominally flat. The output of subsystem 1 is fed directly to the input of current summing amplifier g and thus always contributes to the output. Accordingly its function will not be further described.

The output of each filter of subsystems 2 to 4 is fed simultaneously to the corresponding current-summing amplifier g (e.g., an operational amplifier) input resistors d, e and the amplifier-rectifier system c. The amplifier portion of c has predetermined gain such that when its input signal exceeds some defined small level the rectified output is sufficient to cause voltage-controlled resistor v, which in the quiescent state bypasses a high proportion of the current in resistor d to ground, to permit a portion of that current to flow in e and thus to contribute to the output of the system.

At some higher but still small level, the output of control system c is sufficient to cause v to become an open circuit or nearly so, such that substantially all of the current in e contributes to the output of the system. Typically, c is such that when the portion of the input signal which the corresponding filter f can pass is 1 millivolt, v is just beginning to increase in value, and when the signal is about 3.162 millivolts (an increase in level of 10 db), v has become for practical purposes an open circuit.

In the preferred embodiment of the system as shown an input signal at the common point of the filters of 1 mV or less at all frequencies above 300 Hz will be nearly completely suppressed. Correspondingly, a signal which is larger than about 3.162 mV above 300 Hz at the same point will be transmitted without attenuation.

A composite signal consisting of a mixture of several frequencies above 300 Hz will be transmitted in the following way: those portions of the signal lying within the passband of any subsystems 2 to 4 will be transmitted in full if their combined amplitude exceeds about 3.162 mV, in part if between 1 and 3.162 mV, and not at all if less than 1 mV. (The figures given are for purposes of illustration, and are not intended to limit the generality of the principle.)

The application of the foregoing to noise reduction is as follows: suppose thermal noise (i.e., noise of uniform amplitude regardless of frequency) of level 1 millivolt to be present in an input signal which also contains desired information, but only in some of the filter bands. If this signal is applied to an audio amplifier and loudspeaker, the noise in the immediate vicinity of the desired signal will be masked by the signal, and will in effect be inaudible.

However, noise which is not masked by signal in the same band will be perceived. If the system of FIG. 1 precedes the power amplifier and loudspeaker, then those bands which contain only noise will be unable to contribute to the output signals, while those bands which contain signal will contribute both the signal and noise to the output of the system. However, the signal masks the noise in the same band.

Potentiometer components $b_1$ and $b_2$ permit the input signal to be preferably adjusted to that level which brings the noise which is actually present in the signal down below the threshold level, while preferably leaving the signal output level unaffected. Suppose the signal to contain 10 mV of noise instead of 1 mV. In order to bring the noise below the operating threshold of c and v, the input signal is attenuated e.g., by a factor of 10. This is done by means of $b_1$. However, to do so reduces the current due to signal in resistors d and e by the same factor (20 db); and to restore the original signal level it is necessary to increase the gain of amplifier g by the same factor. This is done by simultaneously attenuating the feedback voltage applied to h by the same factor (10), thus requiring the amplifier to produce ten times the output voltage for the algebraic sum of the currents at the junction of $d_o$, $e_1$ - n and h to be zero. To a first approximation, if $b_1$ and $b_2$ are identical and mechanically ganged together, this requirement is met if effect.

Figure 2:
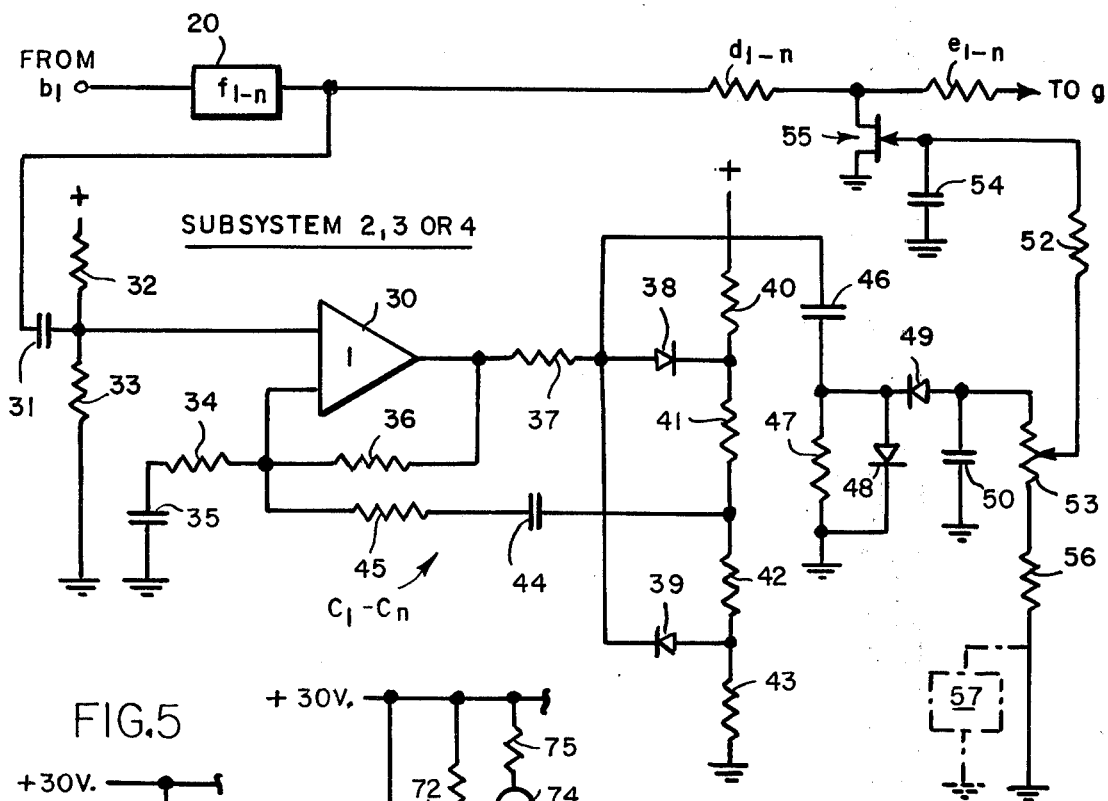
FIG. 2 is a detailed circuit diagram of the preferred control subsystem of the noise suppressor system of this invention.

Reference should now be had to FIG. 2 which shows the preferred form of a subsystem 2, 3, or 4 shown in FIG. 1. In this figure the signal is provided to the subsystem from potentiometer $b_1$. The input signal is then provided to a bandpass filter 20 which has at its output the input resistors 21 and 22 for the current summing amplifier g.

The devices $c_1$ - $_n$ for generating the signal for controlling the voltage controlled resistors $v_1$ - $_n$ shown at 55 comprises an operational amplifier 30 (such as type 709) to which the output from filter 20 is provided via capacitor 31 to the non-inverting input thereof. The input is set at a bias level determined by resistors 32 and 33 such that the output of the operational amplifier 30 is at or near the voltage level present at the junction of equal resistors 41 and 42. The junction of resistors 40 and 41 is at a voltage level above the midpoint i.e., the voltage between resistors 41 and 42 and the junction of resistors 42 and 43 is at a similar voltage level below the midpoint. In this case resistors 40 and 43 are equal. Diodes 38 and 39 do not conduct so long as the output voltage of operational amplifier 30 lies between these two extremes.

So long as the output voltage swing is less positive than the cathode potential of diode 38 and less negative than the anode potential of diode 39, as determined by the potentials at the junctions of 40-41-42-43, the gain of operational amplifier 30 within the band is determined only by resistors 34 and 36. Condenser 35 provides an effective AC ground, while isolating from ground so far as bias is concerned. If the ratio of 36 to 34 is 1000:1, then a 1 mV signal at the junction of 32 and 33 will produce a 1 V output.

However, when the output swing is sufficient to cause diodes 38 and 39 to conduct, an additional feedback current flows through 41 and 42 to resistor 45. Capacitor 44 is a DC blocking condenser. The gain for positive and negative peaks is abruptly reduced to an extent determined by the choice of the value of 45. If this and the voltage divider points are correctly chosen, the DC output of voltage-double system 46-47-48-49-50 increases rapidly at first and then much more slowly, in such a way as to produce the desired control characteristic.

Potentiometer 53 enables the fixed performance of the earlier portion of the system to be adjusted to change the actual attenuation characteristic of a particular specimen of voltage controlled resistor 55 to one which responds gradually as the signal level increases. A unique feature of this means for controlling noise threshold is its inherently low distortion. This arises from the fact that, regardless of the actual noise level in the input to the system, the AC voltage applied to the drain of 55 is always low when 55 is active. Another advantage of the means for controlling noise threshold is that a single set of bandpass filters can be used for both the signal and control chain. Other noise-reducing systems employing active control of signal within bands have required two complete sets of filters; one for the signal chain, one for the control system. These systems in general employ non-linear devices in order to disable their filters, and when the threshold is set high the signal level in these devices is high enough to cause significant signal distortion.

In FIG. 2 the voltage controlled resistor 55 is preferably a field effect transistor and is most preferably that type of field effect transistor known as a VCR 7N made by Siliconics Inc. Such a device will remain in its most heavily conducting condition (lowest resistance; highest attenuation) as the bias on its control electrode (GATE) varies from 0 to say −3 volts. Over a relatively small range, say −3 to −3.5 volts, its effective resistance changes from a few thousand ohms to several million; thus, over the same range of gate voltages the attenuation it produces changes from maximum to zero.

The gate of this VCR 55 is controlled from the voltage provided at the output of resistor 53 which has resistor 56 coupled thereto and is applied to the input thereof via resistor 52. An AC bypass capacitor 54 is provided at the input to the gate of VCR 55. By controlling the resistance at VCR 55 the current to current summing amplifier g is controlled in accordance with the combined magnitude of the signals in each subsystem 2, 3 or 4.

Figure 3:
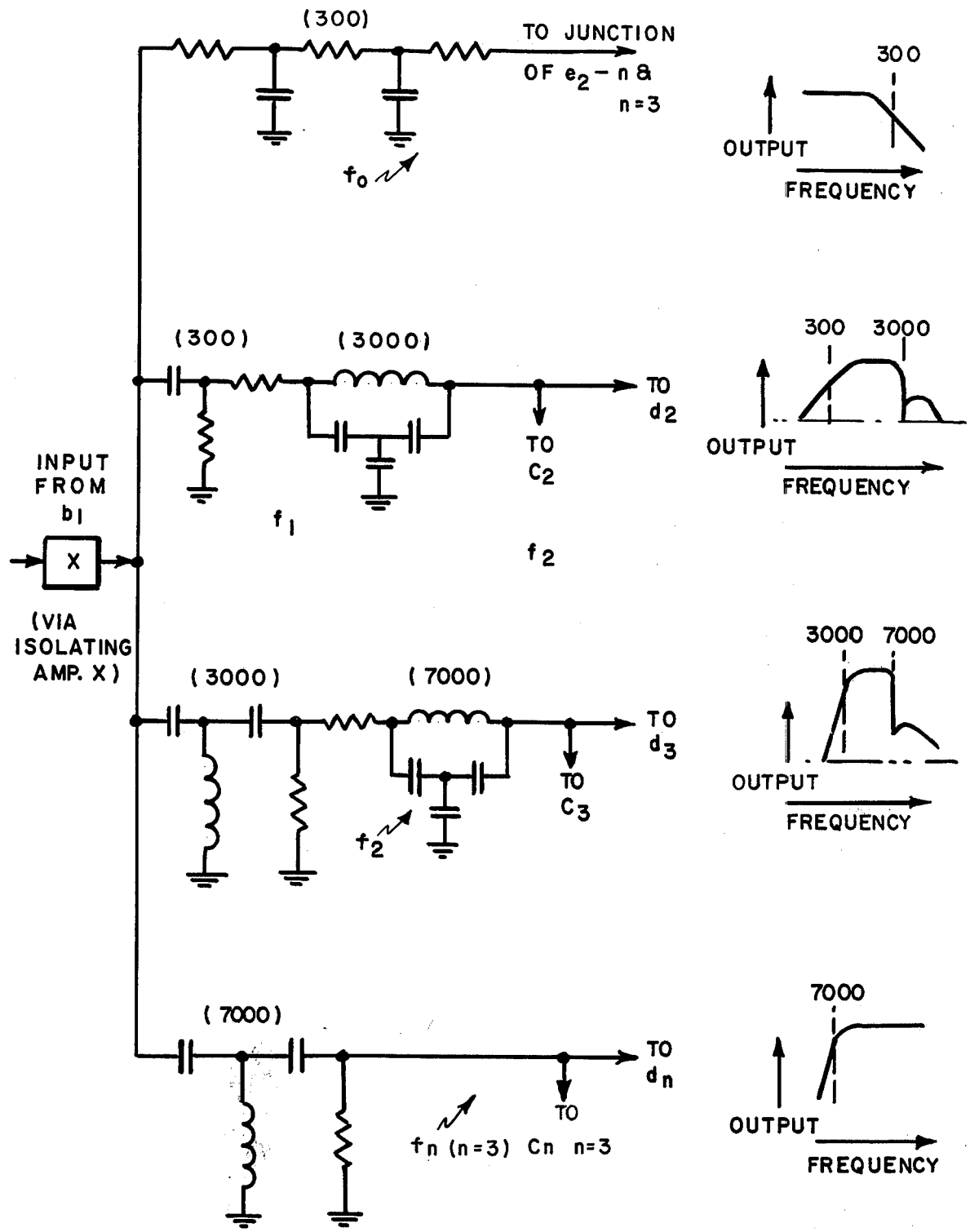
FIG. 3 is a circuit diagram of the filter arrangement of the preferred embodiment of this invention.
Figure 4:
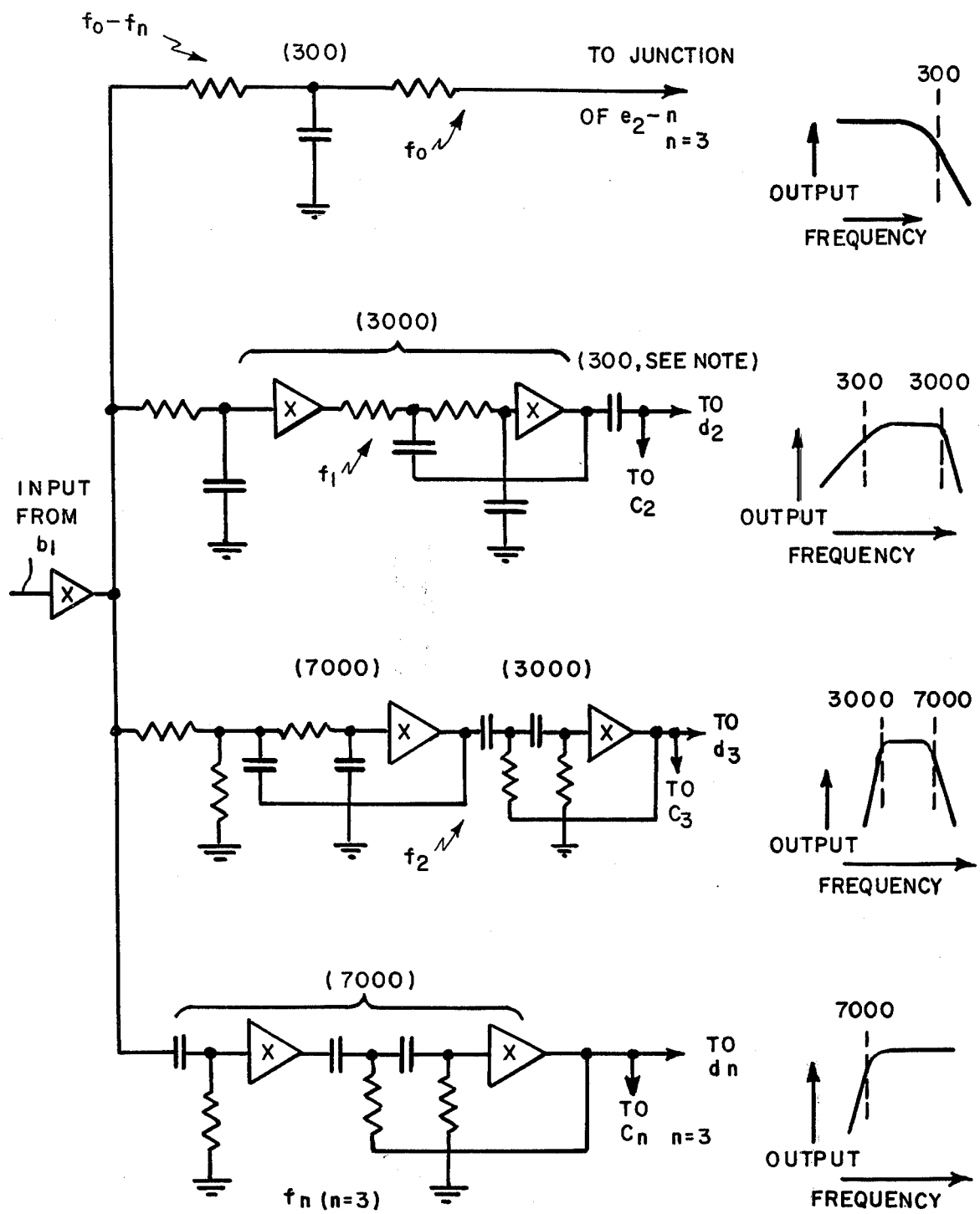
FIG. 4 is a circuit diagram illustrating a modified filter arrangement for this invention.

Reference should now be had to FIGS. 3 and 4 which show typical bandpass filter arrangements for subsystems $f_o$ to $f_n$ (n = 3). It is preferred that the common input to all these bandpass filter arrangements is provided from a conventional isolating amplifier shown as X. FIG. 3 represents the conventional bridged T, LC bandpass filters.

FIG. 4 represents the use of modified Butterworth Filters which are preferred because of their greater ultimate attenuations. In these figures the gain of the various amplifiers X is preferably unit and they are preferably of the high input impedance type.

The filter embodiment of FIG. 4 is preferred (a) when "hum" (strong 50/60 Hz magnetic fields) may be troublesome through induction in the chokes of FIG. 3, and (b) when the application is so critical that adjustment of the band limits is necessary to produce the most uniform possible overall pass-band (when all filters are contributing fully to output).

Reference should now be briefly had to FIG. 2 which discloses a dotted block 57. The block 57 represents a modification which may be made if it is expected that the signals in the filter system will be very large. If this were to occur, distortion could result if the bias on the gate of VCR 55 is not substantially more negative than the greatest possible signal swing at the drain of 55. In a particular specimen of VCR 55 (because of allowed product tolerances) this condition may not be met.

Figure 5:
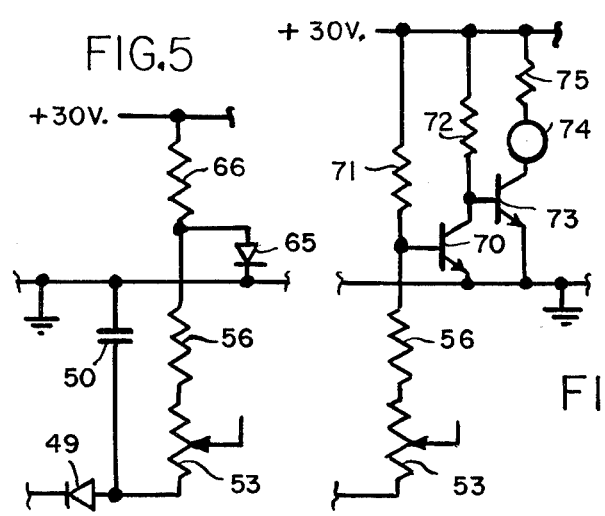
FIG. 5 is a diagram illustrating a modification of the circuit diagram of FIG. 2 for preventing distortion under certain conditions.

When this possibility exists, a network as shown at 57 may be inserted as shown in FIG. 2 and in more detail in FIG. 5. The direct ground to one end of resistor 56 in FIG. 2 would be disconnected.

The network as shown comprises a resistor 66 to the positive supply, and a diode 65 with its cathode grounded and its anode to the junction of the additional resistor 66 and 55. The value of the additional resistor 66 is such that when the detector output into 55 is small the diode clamps 56 to a point just above ground, but when the output is large the potential at 55 can go more negative than ground. As a result, when signals are large, substantially the entire negative DC voltage is applied to the gate of 55 regardless of the setting of 53, providing a large margin of bias safety.

Figure 6:
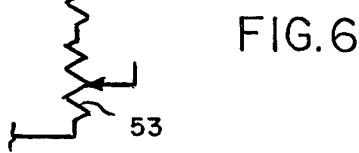
FIG. 6 is a diagram illustrating means for preventing distortion as well as indicating to the user the operation of the suppressor of this invention.

In some cases sophisticated users may wish to know which of the controlled subsystems are contributing to the signal output. This may be accomplished by modifying FIG. 2 as shown in FIG. 6. This configuration of FIG. 6 will also provide the advantages of FIG. 5.

In this case the emitter-base junction of NPN transistor 70 is substituted for diode 65, the collector circuit of 70 can be used to control a device 74, e.g., a lamp, LED, etc., which will indicate the state ("on" or "off") of the corresponding voltage-controlled resistor 55. A resistor 75 is used to limit current in 74.

In FIG. 4, when the voltage at the base of 70 is sufficiently negative to turn 55 off (and thus to cause the corresponding filter f to contribute to the output of the system), resistor 72 permits current to flow in the base of 73, in turn causing collector circuit to flow and energizing indicating device 74, which may be a lamp or light emitting diode. Thus, 74 provides an indication of the state of its associated band, i.e., if a particular subsystem is contributing signal.

As used herein the term bandpass filters includes those filters $f_o$ and $f_n$ (n=3) which have no effective cutoffs beyond the useful signal frequency range as well as those with frequency cutoffs within the useful frequency range.

Thus, for example, $f_n$ (n=3) transmits well above 20000 Hz, the generally accepted upper limit for the ear.

I claim:

1. An audio frequency noise suppressor system comprising first means for receiving and voltage-dividing an input audio signal, a plurality of parallel-connected second means comprising bandpass filters for spectrally-dividing the voltage-divided signal into a corresponding plurality of adjacent band signals, a plurality of third means each coupled to a corresponding second means for attenuating the respective band signal, one or more fourth means, each coupled to a respective coupled second and third means, for essentially linearly controlling the attenuation of said third means by substantially decreasing the magnitude of said band signals from said third means only when the magnitude falls below a predetermined noise threshold, and fifth means for combining said band signals from the outputs of said plurality of third means.

2. The suppressor system of claim 1 in which said fourth means comprises rectifier means for rectifying the signal in the band to provide a control signal to establish the amount of audio signal provided to said fifth means by said third means.

3. The suppressor system of claim 2 in which said third means coupled to fourth means comprises two resistors in series with said second and said fifth means, with said fourth means controlling the amount of signal permitted to flow into one resistor from the other.

4. The suppressor system of claim 1 in which said fourth means comprises a rectifier for deriving a control signal to vary a resistance whose magnitude is established by the magnitude of the control signal.

5. A noise suppressor system comprising a plurality of subsystems for dividing an input signal into a spectral plurality of adjacent band signals, each of said subsystems having a single bandpass filter, means in at least some of said subsystems for attenuating the output of the corresponding bandpass filter, essentially linear control means in each subsystem comprising said attenuating means for controlling the attenuation in response to the corresponding band signal level, such that each band signal is substantially unattenuated when the band signal is above a predetermined noise threshold, and substantially attenuated when the signal is below a predetermined noise threshold, and means for combining the output signals of said subsystems.

6. The system of claim 5 in which said attenuating means comprises current dividing means including a voltage controlled resistor for establishing the amount of signal provided from the subsystem.

7. A noise suppressor system comprising an input to a plurality of subsystems for dividing a signal into a plurality of adjacent spectral band signals, each of said subsystems having a single bandpass filter, adjustable attenuation means in at least some of said subsystems for attenuating the output of the corresponding filter, essentially linear control means in each of said subsystems having said adjustable attenuation means, said control means responsive to the signals in the band provided by the single bandpass filter in said subsystem for deriving a control signal therefrom such that the signals provided from the plurality of bandpass filters are substantially unattenuated when the corresponding signals are above a predetermined noise threshold and substantially attenuated when the corresponding signals are below a predetermined noise threshold, a current summing amplifier coupled to each of said subsystems, and ganged means at the input to the subsystems and at the output of said current summing amplifier for simultaneously adjusting the input and output gain so that the overall gain of the system is constant but the signal level is adjustable to suit a fixed threshold.

8. The system of claim 5 in which said combining means comprises a current summing amplifier.

9. The system of claim 5 in which said subsystems are in parallel with each other.

10. The system of claim 5 in which at least some of said filters comprise filters of the Butterworth Design.

11. The system of claim 5 in which said control means comprises a rectifier means.

12. The system of claim 5 in which at least some of said subsystems have means for indicating if said subsystems are providing a signal at the output thereof.

13. The system of claim 7 in which the ganged means comprises two potentiometers, one at the input to the subsystems and one at the output of the current summing amplifier.

* * * * *